United States Patent
Hsieh

(10) Patent No.: US 10,535,702 B1
(45) Date of Patent: Jan. 14, 2020

(54) IMAGE SENSOR

(71) Applicant: UNITED MICROELECTRONICS CORP., Hsinchu (TW)

(72) Inventor: Cheng-Yu Hsieh, Hsinchu (TW)

(73) Assignee: United Microelectronics Corp., Hsinchu (TW)

( * ) Notice: Subject to any disclaimer, the term of this patent is extended or adjusted under 35 U.S.C. 154(b) by 0 days.

(21) Appl. No.: 16/176,581

(22) Filed: Oct. 31, 2018

(30) Foreign Application Priority Data

Oct. 15, 2018 (CN) .......................... 2018 1 1196686

(51) Int. Cl.
*H01L 27/146* (2006.01)

(52) U.S. Cl.
CPC .. *H01L 27/14649* (2013.01); *H01L 27/14621* (2013.01); *H01L 27/14627* (2013.01); *H01L 27/14645* (2013.01)

(58) Field of Classification Search
CPC ......... H01L 27/14649; H01L 27/14621; H01L 27/14627; H01L 27/14645
See application file for complete search history.

(56) References Cited

U.S. PATENT DOCUMENTS

| | | | |
|---|---|---|---|
| 7,235,833 B2 | 6/2007 | Chen | |
| 7,755,122 B2 | 7/2010 | Lee | |
| 9,496,304 B2 | 11/2016 | Hu et al. | |
| 9,711,560 B2 | 7/2017 | Tsai et al. | |
| 9,939,251 B2 | 4/2018 | Haddad et al. | |
| 2002/0034878 A1* | 3/2002 | Kimata | H01L 21/3065 438/700 |
| 2006/0219862 A1 | 10/2006 | Ho et al. | |
| 2014/0111652 A1 | 4/2014 | So et al. | |
| 2015/0155320 A1* | 6/2015 | Chien | H01L 27/14623 257/432 |
| 2016/0064456 A1* | 3/2016 | Lee | H01L 27/307 257/40 |
| 2016/0099272 A1 | 4/2016 | Wang | |
| 2017/0366770 A1* | 12/2017 | Yokogawa | H04N 5/23212 |
| 2018/0069046 A1* | 3/2018 | Jin | H01L 27/14621 |
| 2018/0151619 A1* | 5/2018 | Yamashita | H01L 27/14649 |
| 2019/0189818 A1* | 6/2019 | Chen | H01L 31/03525 |
| 2019/0229141 A1* | 7/2019 | Kim | H01L 27/14605 |
| 2019/0252439 A1* | 8/2019 | Ogawa | H01L 27/14623 |
| 2019/0252466 A1* | 8/2019 | Yoo | H01L 31/02162 |

* cited by examiner

*Primary Examiner* — Nathan W Ha
(74) *Attorney, Agent, or Firm* — J.C. Patents

(57) ABSTRACT

An image sensor includes a first photodiode formed in a first substrate. A first deep-trench isolation (DTI) structure is in the first substrate and surrounds the first photodiode. A first inter-dielectric layer having a first circuit structure is formed on the first substrate. A bonding layer is between the first inter-dielectric layer and a second inter-dielectric layer. The second-inter dielectric layer having a second circuit structure is on the bonding layer. A connection wall is disposed in the first inter-dielectric layer, the bonding layer, and the second inter-dielectric layer to physically connect the first circuit structure and the second circuit structure. A second substrate is disposed on the second inter-dielectric layer. A second photodiode is formed in the second substrate. A second DTI structure is in the second substrate and surrounds the second photodiode.

12 Claims, 1 Drawing Sheet

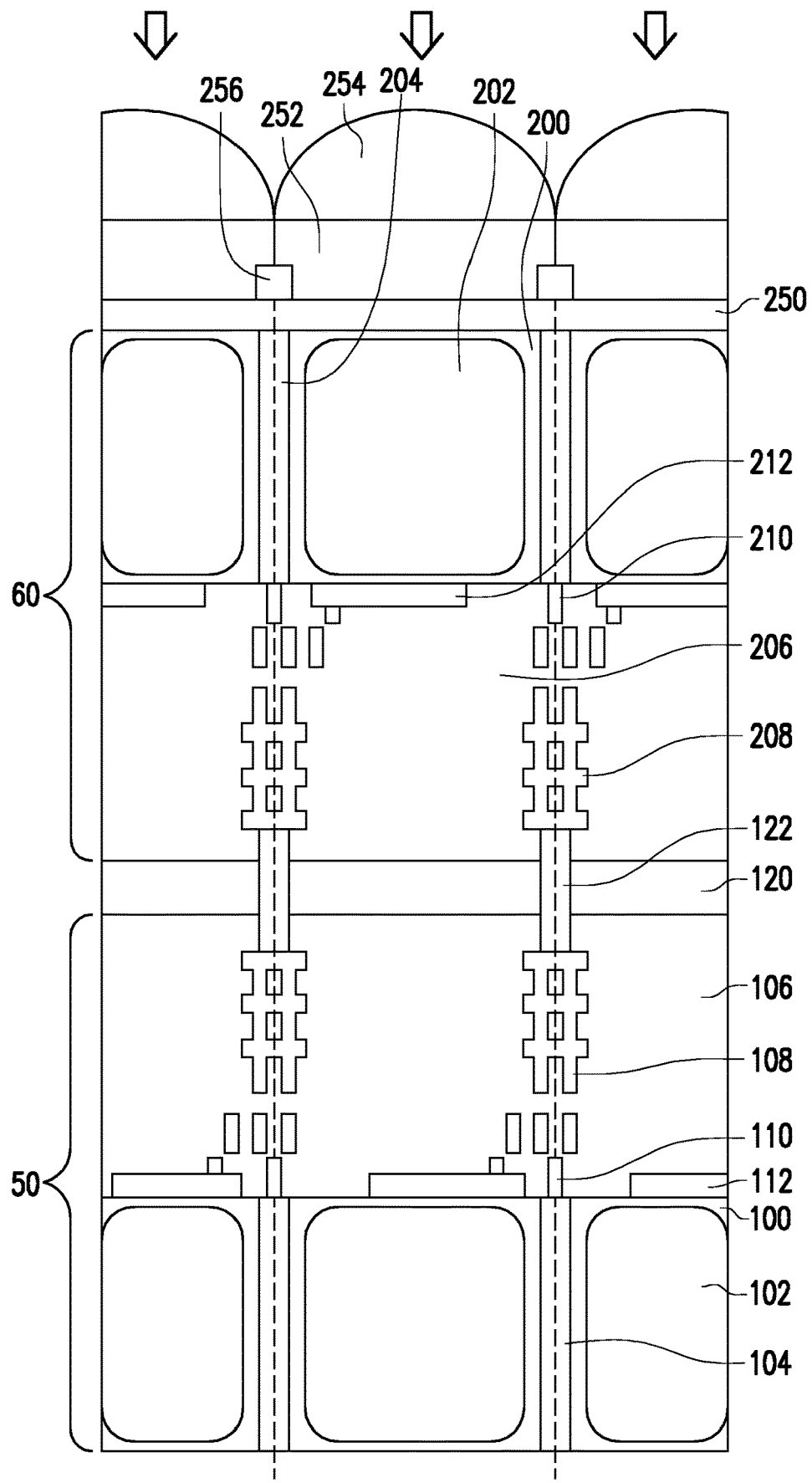

IMAGE SENSOR

CROSS-REFERENCE TO RELATED APPLICATION

This application claims the priority benefit of China application serial no. 201811196686.0, filed on Oct. 15, 2018. The entirety of the above-mentioned patent application is hereby incorporated by reference herein and made a part of this specification.

BACKGROUND OF THE INVENTION

Field of the Invention

The invention relates to semiconductor device technique, and more particularly, to a technique of an image sensor.

Description of Related Art

The image sensor is a device that acquires images, and it is compatible with modern technology and digitalized electronic products and has a wide range of applications in daily life. For example, in a camera or camera application, a digital image may be acquired. Digital images are generally combined into a single image by a plurality of pixels in an array. Each sub-pixel corresponds to the primary color it is responsible for, and is manufactured by one sub-image sensing device. The sensing device is a semiconductor structure. As is generally known, one color is composed of at least three primary colors, and therefore each complete pixel generally corresponds to at least three primary colors. As to the hardware structure, it includes three color-sensing devices.

The front relates to an image of general visible light. However, for the wide-range demand for image information, in addition to being able to sense images of visible light, images of infrared light may also be sensed at the same time. Therefore, under this trend, one pixel of the image sensor needs to be capable of sensing both visible light and infrared light.

Moreover, in response to the dramatic increase in image resolution, the size of the sensing pixels also needs to be greatly reduced. Therefore, the issue of crosstalk is likely to occur between adjacent pixels. In addition to the sensing of infrared light, if the absorption of infrared light is insufficient, then the issue of poor sensing quality also occurs.

When designing an image sensor, under the requirement of sensing both visible light and infrared light, it is also necessary to consider reducing the crosstalk between adjacent pixels and at the same time improving the infrared light sensing capability.

SUMMARY OF THE INVENTION

The invention provides an image sensor that may simultaneously detect visible light and infrared light, reduce crosstalk between adjacent pixels, and simultaneously improve the sensing capability of infrared light.

According to an embodiment, the invention provides an image sensor including a first substrate. A first photodiode is formed in the first substrate and located in a pixel region. A first deep-trench isolation structure passes through the first substrate and surrounds the first photodiode. A first inter-dielectric layer is disposed on the first substrate. A first circuit structure is formed in the first inter-dielectric layer and extended outward from the first deep-trench isolation structure. A bonding layer is disposed on the first inter-dielectric layer. A second inter-dielectric layer is disposed on the bonding layer. A second circuit structure is formed in the second inter-dielectric layer and aligned with the first deep-trench isolation structure or the first circuit structure. A connection wall is disposed in the first inter-dielectric layer, the bonding layer, and the second inter-dielectric layer to physically connect the first circuit structure and the second circuit structure. A second substrate is disposed on the second inter-dielectric layer. A second photodiode is disposed in the second substrate and corresponds to the pixel region. A second deep-trench isolation structure passes through the second substrate and surrounds the second photodiode. The second deep-trench isolation structure is physically connected to the second circuit structure. When incident light enters the second photodiode, the incident light reaches the first photodiode by reflection.

According to an embodiment, for the image sensor, the first photodiode is a near-infrared photodiode, and the second photodiode is a visible light photodiode.

According to an embodiment, the image sensor further includes an anti-reflection layer on the second substrate. A color filter layer is disposed above the anti-reflection layer. A lens is disposed on the color filter layer, and a portion of the incident light is received corresponding to the second photodiode.

According to an embodiment, for the image sensor, the color filter layer is one of red light, green light, and blue light.

According to an embodiment, for the image sensor, the connection wall is silicon nitride or a metal.

According to an embodiment, for the image sensor, the connection wall provides a degree of reflection that is required to reflect the incident light.

According to an embodiment, for the image sensor, the thickness of each of the first substrate and the second substrate is greater than or equal to 2.5 microns.

According to an embodiment, for the image sensor, the incident light is at least reflected by the first circuit structure, the connection wall, and the second circuit structure to generate a plurality of dispersed incident angles so as to enter the first photodiode.

According to an embodiment, the image sensor further includes a first polysilicon layer in the first inter-dielectric layer and a second polysilicon layer in the second inter-dielectric layer.

According to an embodiment, for the image sensor, the first circuit structure includes a first metal wall in contact with and connected to the first deep-trench isolation structure, and the second circuit structure includes a second metal wall in contact with and connected to the second deep-trench isolation structure.

According to an embodiment, for the image sensor, the first deep-trench isolation structure, the first circuit structure, the connection wall, the second circuit structure, and the second deep-trench isolation structure form a tubular structure, and infrared light carried in the incident light is guided by the tubular structure to reach the first photodiode.

According to an embodiment, for the image sensor, the incident light includes visible image light and infrared image light.

In order to make the aforementioned features and advantages of the disclosure more comprehensible, embodiments accompanied with FIGURES are described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

FIG. 1 is a schematic showing the basic structure of an image sensor according to an embodiment of the invention.

DESCRIPTION OF THE EMBODIMENTS

Hereinafter, exemplary embodiments of the invention are described in detail, and examples of the exemplary embodiments are conveyed via the FIGURES. Wherever possible, the same reference numerals are used in the figures and the descriptions to refer to the same or similar portions.

The invention proposes an improved technique for an image sensor, which is an architecture including two photodiodes stacked together that respectively sense visible light and infrared light. In regards to improving image resolution, the pixel structure of the image sensor faces issues of device size reduction, infrared light sensing quality, crosstalk between pixels, and the like.

The invention provides an image sensor of a double photodiode, wherein the structure of one sensing pixel is formed by stacking a photodiode of visible light and a photodiode of infrared light. The photodiode of visible light is disposed at the near end with respect to the incident end of the light, and the photodiode of infrared light is disposed at the far end. Since the photodiode of infrared light is disposed at the far end, the absorption of the infrared light may be enhanced, thereby improving the sensing quality of the infrared light.

Moreover, the peripheries of the photodiodes of visible light and infrared light surround the photodiodes by a structure of deep-trench isolation, so that adjacent pixels achieve optical isolation effect to reduce crosstalk effect. The invention also utilizes an interconnecting metal structure at the back end and a connection wall connecting the interconnected metal structures of the two to achieve a tubular structure. The image light enters from the incident end, and first passes through the photodiode of visible light, and the infrared light propagates through a longer distance to the remote near-infrared (NIR) photodiode. Such a whole pixel may effectively prevent crosstalk between adjacent pixels and increase the sensing quality of infrared light without increasing the area occupied by the devices.

The following embodiments are given to illustrate the invention, but the invention is not limited to the embodiments.

FIG. 1 is a schematic showing the basic structure of an image sensor according to an embodiment of the invention. Referring to FIG. 1, the image sensor is exemplified by the structure of one pixel. A photodiode close to the incident end in one pixel is used to sense incident visible light. However, the incident light generally passes through the filter device to become a monochromatic primary color light, such as one of red light, green light, and blue light. The incident light passes through the filter device and enters the corresponding pixel, and the visible light component is first sensed at the near-end photodiode, and the remote photodiode receives and senses the infrared light component in the incident light.

An image sensor completed by a semiconductor manufacturing technique includes a plurality of sensing pixels. One pixel, such as the area shown by the dashed line, overall includes a remote sensing structure 50, a bonding layer 120, and a near-end sensing structure 60. The remote sensing structure 50 and the near-end sensing structure 60 are connected by the bonding layer 120 to achieve a mechanical stacked structure. Moreover, some optical devices are disposed on the near-end sensing structure 60 for receiving incident light as indicated by the arrows. The incident light includes components of visible light and infrared light. The visible light is sensed by the near-end sensing structure 60. Infrared light may pass through the near-end sensing structure 60, but via the tubular structure proposed by the invention, the infrared light carried in the incident light is guided by the tubular structure to the remote sensing structure 50.

A more detailed structure is described as follows. The remote sensing structure 50 includes a first substrate 100. A first photodiode 102 is formed in the first substrate 100, located in the pixel region, and is, for example, the area defined by the dashed line. The thickness of the first substrate 100 is, for example, greater than or equal to 2.5 microns, more preferably greater than or equal to 3 microns. The first photodiode 102 is a remote photodiode with respect to the incident light and is used to sense infrared light. The first photodiode 102 is, for example, a near-infrared (NIR) photodiode. The manufacture of the first photodiode 102 is completed by appropriate doping using a semiconductor material of the first substrate 100. The actual manufacturing process thereof may be inferred from a conventional structure and manufacturing method, and is not described herein. The invention does not limit variations in the specific structure of the first photodiode 102. Similarly, the invention is not limited to a particular second photodiode 202 that senses infrared light.

A first deep-trench isolation structure 104 passes through the first substrate 100 and surrounds the first photodiode 102. The first deep-trench isolation structure 104 has a reflective effect that reduces infrared light from entering adjacent pixels, thus alleviating the issue of crosstalk. The mechanism for improving the quality of infrared light sensing is achieved based on the overall structure, which is described later.

A first inter-dielectric layer 106 is disposed on the first substrate 100. A first circuit structure 108 is formed in the first inter-dielectric layer 106. The first circuit structure 108 is connected to the first deep-trench isolation structure 104, i.e., the first circuit structure 108 is extended outward/upward from the first deep-trench isolation structure 104. The first circuit structure 108 is an internal circuit that controls the first photodiode 102 and external connections. According to a semiconductor manufacture technique, the first circuit structure 108 requires a first inter-dielectric layer 106 to complete manufacture, and descriptions thereof on the details of the actual structure and manufacturing process are omitted.

To achieve the desired tubular structure of the invention, the first circuit structure 108, for example, further includes a metal wall 110 such that the first circuit structure 108 is more closely connected to the first deep-trench isolation structure 104 to achieve the desired tubular structure and reduce light leakage in small areas. Moreover, in conjunction with the design of the first photodiode 102, in the first inter-dielectric layer 106, in one embodiment, for example, a polysilicon layer 112 may also be included. That is, other external circuits required for the operation of the first photodiode 102 are formed in the first inter-dielectric layer 106.

In an embodiment, the remote sensing structure 50 and the near-end sensing structure 60 may be separately manufactured, and then the remote sensing structure 50 and the near-end sensing structure 60 are bonded and fixed using the bonding layer 120 to achieve integration of the stack. The bonding layer 120 is disposed on the first inter-dielectric layer 106 and the second inter-dielectric layer 206 in terms of the manufactured structure. The bonding layer 120 is, for example, another stage of dielectric layer for bonding the remote sensing structure 50 and the near-end sensing structure 60.

The second inter-dielectric layer 206 is disposed on the bonding layer 120. A second circuit structure 208 is formed in the second inter-dielectric layer 206. The second circuit structure 208 is, for example, aligned with the first deep-trench isolation structure 104 or the first circuit structure 108. Here, the second inter-dielectric layer 206 and the second circuit structure 208 are part of the near-end sensing structure 60. Similar to the manufacture of the first inter-dielectric layer 106 and the first circuit structure 108 of the remote sensing structure 50, the second circuit structure 208 is an external circuit that controls the operation of the second photodiode 202 and is not described herein. The second circuit structure 208 further includes a metal wall 210 that functions the same as the metal wall 110 of the first circuit structure 108 such that the metal wall 210 may effectively reduce or eliminate voids in the second circuit structure 208 that may substantially create light leakage.

In order to achieve the desired tubular structure, the connection wall 122 is disposed in the first inter-dielectric layer 106, the bonding layer 120, and the second inter-dielectric layer 206, and is physically connected to the first circuit structure 108 and the second circuit structure 208. The material of the connection wall 122 may be a metal, nitride, or silicon nitride. That is, the connection wall 122 is a structure and material that may substantially reflect infrared light. Moreover, in an embodiment, the second inter-dielectric layer 206 may also include a polysilicon layer 212 based on actual need.

A second substrate 200 is disposed on the second inter-dielectric layer 206. A second photodiode 202 is disposed in the second substrate 200 and corresponds to the pixel region. The second photodiode 202 is, for example, a photodiode for sensing visible light. The thickness of the second substrate 200 is, for example, greater than or equal to 2.5 microns, more preferably greater than or equal to 3 microns.

The incident light as indicated by the arrows contains visible light and infrared light. It should be noted here that, based on the setting of the wavelength range of infrared light, the incident light substantially includes, for example, the wavelength range of near-infrared light. The visible light in the incident light is generally known, and is, for example, a color light composed of three primary colors of red light, green light, and blue light. According to the general design, one pixel senses one primary color, so that the incident light is first condensed and filtered by some optical devices. For example, a lens 254 first condenses a portion of the incident light corresponding to the pixel, and then the incident light is filtered by a filter layer 252 to obtain a predetermined primary color light, such as red light, green light, or blue light. Moreover, the optical device further includes an anti-reflection layer 250 on the second substrate 200. The positions of the filter layer 252 and the lens 254 corresponding to the pixels are sequentially disposed on the anti-reflection layer 250. Moreover, the optical device may further include a grid-like structure 256 disposed in the filter layer 252 corresponding to the periphery of the pixels to surround the pixel region. The optical device may have different architectures depending on actual needs. The invention is not limited to a particular optical device.

To achieve the effect of reducing crosstalk, the corresponding second photodiode 202 of the invention is also provided with a second deep-trench isolation structure 204 that passes through the second substrate 200 and surrounds the second photodiode 202. The second deep-trench isolation structure 204 is physically connected to the second circuit structure 208.

For the overall effect, when the incident light enters the second photodiode 202, the component of the visible light is absorbed by the second photodiode 202, wherein the reflective effect of the second deep-trench isolation structure 204 may limit the incident light to the pixel, thus effectively reducing the crosstalk effect. At the same time, the absorption path of the second photodiode 202 is increased due to the reflective effect, thereby increasing the sensing quality.

The component of the infrared light passes through the second photodiode 202 and continues to be reflected and travel through a tubular structure, and after traveling a longer distance, the component of the infrared light propagates to the remote first photodiode 102. The reflection of the infrared light over a longer distance in a tubular structure thus causes the light travel angle to be dispersed. That is, the incident angle of the infrared light entering the first photodiode 102 is dispersed into a wide range, wherein the large angle of the incident light has a longer travel path in the first photodiode 102, thereby increasing the amount of the infrared light absorbed. Therefore, the structure provided by the invention may increase the sensing quality of infrared light, and at the same time the first deep-trench isolation structure 104 may also reduce crosstalk phenomenon.

In the image sensor for a double photodiode of the invention, the photodiode of visible light is disposed at the near end, and the photodiode of infrared light is disposed at the far end. The tubular structure provided by the invention may reduce the crosstalk phenomenon and improve the sensing quality for visible light. Infrared light is guided by the tubular structure to enter the photodiode of infrared light. After traveling a longer distance in the tubular structure for the infrared light, the infrared light may generate a large incident angle to enter the remote photodiode, and therefore the absorption of infrared light may be enhanced, and as a result the sensing quality of infrared light is improved.

Lastly, it should be mentioned that: each of the above embodiments is only used to describe the technical solutions of the invention and is not intended to limit the invention; and although the invention is described in detail via each of the above embodiments, those having ordinary skill in the art should understand that: modifications may still be made to the technical solutions recited in each of the above embodiments, or portions or all of the technical features thereof may be replaced to achieve the same or similar results; the modifications or replacements do not make the nature of corresponding technical solutions depart from the scope of the technical solutions of each of the embodiments of the invention.

What is claimed is:

1. An image sensor, comprising:
   a first substrate;
   a first photodiode formed in the first substrate and located in a pixel region;
   a first deep-trench isolation structure passing through the first substrate and surrounding the first photodiode;
   a first inter-dielectric layer disposed on the first substrate;
   a first circuit structure formed in the first inter-dielectric layer and extended outward from the first deep-trench isolation structure;
   a bonding layer disposed on the first inter-dielectric layer;
   a second inter-dielectric layer disposed on the bonding layer;

a second circuit structure formed in the second inter-dielectric layer and aligned with the first deep-trench isolation structure or the first circuit structure;

a connection wall disposed in the first inter-dielectric layer, the bonding layer, and the second inter-dielectric layer to physically connect the first circuit structure and the second circuit structure;

a second substrate disposed on the second inter-dielectric layer;

a second photodiode disposed in the second substrate and corresponding to the pixel region; and a second deep-trench isolation structure passing through the second substrate and surrounding the second photodiode, wherein the second deep-trench isolation structure is physically connected to the second circuit structure, wherein when an incident light enters the second photodiode, the incident light reaches the first photodiode by reflection.

2. The image sensor of claim 1, wherein the first photodiode is a near-infrared photodiode, and the second photodiode is a visible light photodiode.

3. The image sensor of claim 1, further comprising:
an anti-reflection layer on the second substrate;
a color filter layer disposed above the anti-reflection layer; and
a lens disposed on the color filter layer, and a portion of the incident light is received corresponding to the second photodiode.

4. The image sensor of claim 3, wherein the color filter layer corresponds to a red light, a green light, or a blue light.

5. The image sensor of claim 1 wherein the connection wall is silicon nitride or a metal.

6. The image sensor of claim 1, wherein the connection wall provides a degree of reflection required to reflect the incident light.

7. The image sensor of claim 1, wherein a thickness of each of the first substrate and the second substrate is greater than or equal to 2.5 microns.

8. The image sensor of claim 1, wherein the incident light is at least reflected by the first circuit structure, the connection wall, and the second circuit structure to generate a plurality of dispersed incident angles so as to enter the first photodiode.

9. The image sensor of claim 1, further comprising:
a first polysilicon layer in the first inter-dielectric layer; and
a second polysilicon layer in the second inter-dielectric layer.

10. The image sensor of claim 1, wherein the first circuit structure comprises a first metal wall in contact with and connected to the first deep-trench isolation structure, and the second circuit structure comprises a second metal wall in contact with and connected to the second deep-trench isolation structure.

11. The image sensor of claim 1, wherein the first deep-trench isolation structure, the first circuit structure, the connection wall, the second circuit structure, and the second deep-trench isolation structure form a tubular structure, and an infrared light carried in the incident light is guided by the tubular structure to reach the first photodiode.

12. The image sensor of claim 1, wherein the incident light comprises a visible image light and an infrared image light.

* * * * *